(12) United States Patent
Aoyama et al.

(10) Patent No.: US 8,552,411 B2
(45) Date of Patent: Oct. 8, 2013

(54) MANUFACTURING METHOD OF SEMICONDUCTOR DEVICE

(75) Inventors: Tomonori Aoyama, Yokohama (JP); Kiyotaka Miyano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 13/249,503

(22) Filed: Sep. 30, 2011

(65) Prior Publication Data
US 2012/0225498 A1 Sep. 6, 2012

(30) Foreign Application Priority Data
Mar. 1, 2011 (JP) ................................. 2011-044217

(51) Int. Cl.
*H01L 21/02* (2006.01)
(52) U.S. Cl.
USPC .. 257/3; 438/382; 257/E21.002; 257/E21.004
(58) Field of Classification Search
USPC ........................................ 438/3, 48; 257/295
See application file for complete search history.

(56) References Cited

U.S. PATENT DOCUMENTS

| 7,291,506 B2 * | 11/2007 | Nakajima et al. ................. 438/3 |
| 8,080,463 B2 * | 12/2011 | Iwasawa et al. ............... 438/423 |
| 2004/0023513 A1 * | 2/2004 | Aoyama et al. ................ 438/778 |
| 2005/0032382 A1 * | 2/2005 | Rossman ....................... 438/695 |
| 2011/0008952 A1 | 1/2011 | Aoyama |
| 2011/0076842 A1 | 3/2011 | Yoshino et al. |
| 2011/0111580 A1 | 5/2011 | Aoyama et al. |
| 2011/0215333 A1 | 9/2011 | Aoyama et al. |
| 2011/0227017 A1 * | 9/2011 | Yasutake ........................... 257/2 |

FOREIGN PATENT DOCUMENTS

| JP | 4-93029 | 3/1992 |
| JP | 4-338644 | 11/1992 |
| JP | 2008-159824 | 7/2008 |

OTHER PUBLICATIONS

Aoyama, T. et al., "Semiconductor Device and Method for Manufacturing the Same," U.S. Appl. No. 13/017,498, filed Jan. 31, 2011.

* cited by examiner

*Primary Examiner* — Zandra Smith
*Assistant Examiner* — Damian A Hillman
(74) *Attorney, Agent, or Firm* — Finnegan, Henderson, Farabow, Garrett & Dunner, L.L.P.

(57) ABSTRACT

According to one embodiment, a manufacturing method of semiconductor device includes forming plural elements on a substrate, forming a silicon compound film so as to bury between a plurality of elements, and modifying the silicon compound film to a silicon dioxide film by radiating microwaves.

16 Claims, 5 Drawing Sheets

MANUFACTURING METHOD OF SEMICONDUCTOR DEVICE

CROSS-REFERENCE TO RELATED APPLICATION

This application is based upon and claims the benefit of priority from prior Japanese Patent Application No. 2011-044217, filed on Mar. 1, 2011, the entire contents of which are incorporated herein by reference.

FIELD

Embodiments of the present invention relate to a manufacturing method of a semiconductor device.

BACKGROUND

As memories of next and subsequent generations, Magnetoresistive Random Access Memory (MRAM) is examined. MRAM stores data using Tunneling Magneto-Resistance Effect.

MRAM has plural Magnetic Tunnel Junction (MTJ) elements disposed in a matrix state. Each MTJ element has a layered structure composed of two magnetic layers interposed between a lower electrode and an upper electrode and a nonmagnetic layer sandwiched between the two magnetic layers.

Since the magnetic layers provided with the MTJ element have a low heat resistance, the characteristics of the MTJ element may be changed by the heat applied to the magnetic layers in a manufacturing process. Thus, in a process for manufacturing MRAM, after an MTJ element is formed, it is necessary to keep a process temperature to a predetermined temperature or less, for example, 500° C. or less so that the MTJ element is not degraded by heat.

Further, interlayer dielectric films are interposed between respective MTJ elements to electrically isolate the respective MTJ elements. The interlayer dielectric film is composed of, for example, a silicon dioxide films, and a method of using polysilazane (PSZ) is available as a method of forming the silicon dioxide film.

To describe the method of using PSZ in more detail, a PSZ solution is applied to the entire surface of a substrate on which an MTJ element is disposed, a solvent in the PSZ solution is volatilized by baking, and then the PSZ is heated to 600 to 650° C. using electromagnetic waves having a short wavelength, i.e., ultraviolet rays, visible light rays, infrared rays or the like under an atmosphere which contains oxygen or water vapor.

DETAILED DESCRIPTION

Figure 1A:
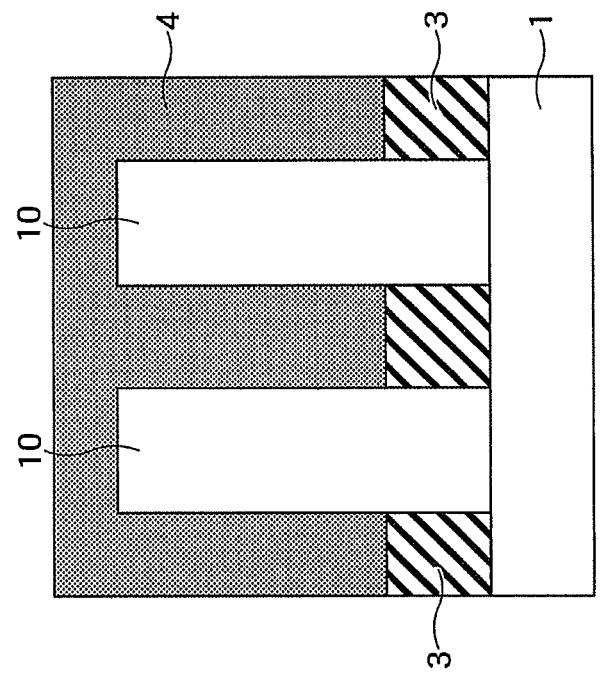
FIGS. 1A and 1B are cross-sectional views (part 1) showing a manufacturing method a semiconductor device of an embodiment.

In one embodiment, a manufacturing method of a semiconductor device forms plural elements on a substrate, forms silicon compound films so as to bury between the plural elements, and modifies the silicon compound films to silicon dioxide films by radiating microwaves.

Embodiments will be described referring to the drawings. However, the present invention is not limited to the embodiments. Note that the portions common to all the drawings are denoted by common reference numerals and a duplicate description is omitted. Further, the drawings are schematic views for describing the embodiments and supporting the understanding of the embodiments, and, although shapes, dimensions, ratios, and the like of some schematic views may differ from those of an actual device, the designs of the shapes, dimensions, ratios, and the like can be appropriately changed in consideration of the following description and known arts.

First Embodiment

A manufacturing method of a semiconductor device of a first embodiment will be described using from FIGS. 1A to 4. FIGS. 1A to 3 show cross-sectional views of the semiconductor device of the present embodiment in manufacturing processes of the semiconductor device. FIG. 4 is a view schematically showing a manufacturing apparatus of the embodiment. Although the following description is made using a manufacturing method of a MRAM 100 as an example, the present invention is not limited to such a semiconductor device, and the manufacturing method can be used also in other types of semiconductor devices and can be used to a manufacturing method of a cross-point memory such as, for example, Resistance Change Random Access Memory (ReRAM) having a variable resistive element with poor heat resistance.

First, a substrate 1 on which plural MTJ elements 10 are formed in a matrix state is prepared. As shown in FIG. 1A, each of the MTJ elements 10 has a layered structure composed of, for example, two magnetic layers (not shown) interposed between a lower electrode (not shown) and an upper electrode (not shown) and a nonmagnetic layer (not shown) sandwiched between the two magnetic layers as described previously. Further, lower side walls of the respective MTJ elements 10 are covered with lower interlayer dielectric films 3. The lower interlayer dielectric film 3 is a silicon dioxide film formed of, for example, PSZ (polysilazane).

Since the lower interlayer dielectric films 3 are formed before the MTJ elements 10 are formed, the lower interlayer dielectric films 3 may be formed using a well-known method by which the lower interlayer dielectric films 3 are made to a high temperature and further may be formed by an embodiment described below.

Figure 1B:
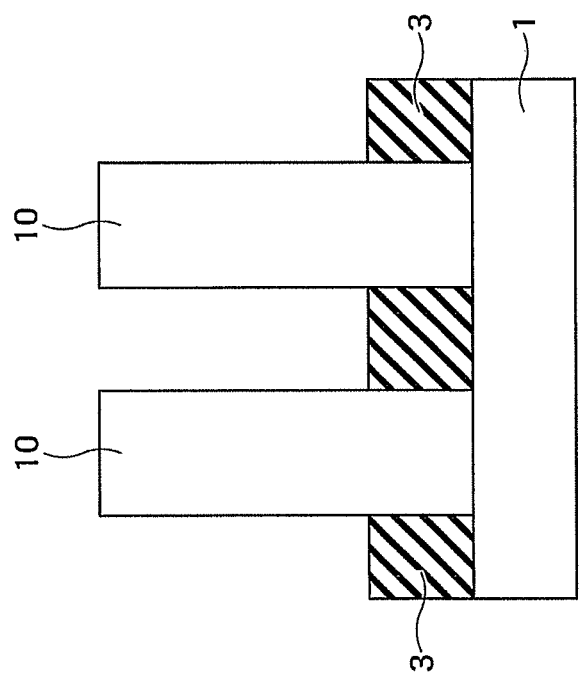

Next, as shown in FIG. 1B, the entire surface of the substrate 1 is applied with, for example, a PSZ solution (silicon compound solution) 4. Main components of the PSZ are silicon, nitrogen, and hydrogen. The PSZ solution 4 can be buried between the MTJ elements 10 with a good step covering property by applying the PSZ solution 4.

Figure 2A:
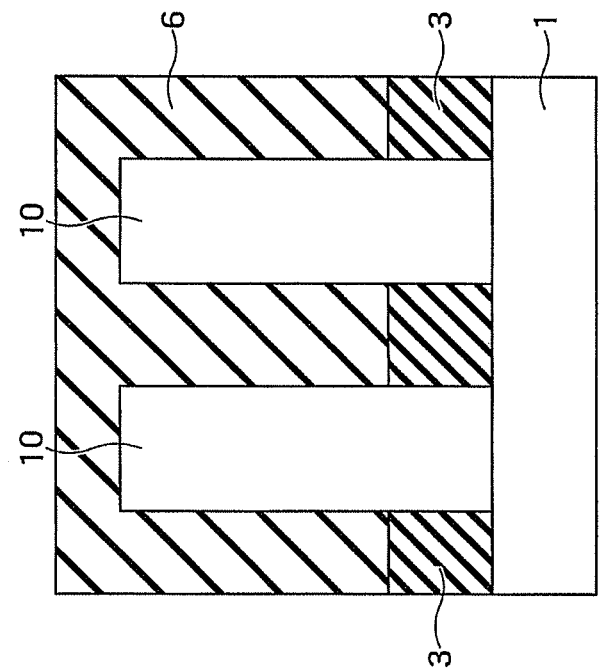
FIGS. 2A and 2B are cross-sectional views (part 2) showing the manufacturing method the semiconductor device of the embodiment.

Next, as shown in FIG. 2A, a solvent contained in the PSZ solution 4 is volatilized by performing baking at a temperature between 200° C. to 300° C., and PSZ films (silicon compound films) 5 are formed on and between the MTJ elements 10. Note that when a solvent includes a molecule structure with polarization, since the solvent is volatilized when the microwaves are radiated at a next step, the baking may be omitted.

Figure 2B:
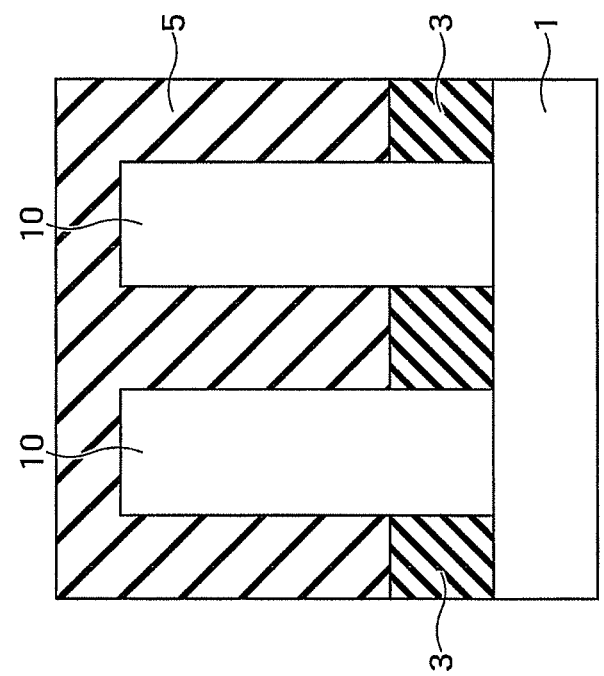

Thereafter, as shown in FIG. 2B, microwaves are radiated to the substrate 1 under an atmosphere which contains oxygen or water vapor, thereby modifying the PSZ films 5 to silicon dioxide films 6. In more detail, since nitrogen contained in the PSZ films 5 is replaced with oxygen under the atmosphere and hydrogen is eliminated, the PSZ films 5 are modified to the silicon dioxide films 6.

The pressure of the atmosphere containing the oxygen or the water vapor at the time the microwaves are radiated is preferably a pressure at which no radical is generated even if the microwaves are used and is, for example, the atmospheric pressure or a pressure slightly lower than the atmospheric pressure. When radical is generated, since a modification reaction of the PSZ films 5 is excessively promoted by the radical, oxygen may be captured in the silicon dioxide films 6 more than the stoichiometric proportion. A charge is generated in the silicon dioxide films 6 by oxygen captured in the large amount with a result that characteristics of the silicon dioxide films 6 such as a withstand voltage and a leak current are degraded. Accordingly, the pressure at which no radical is generated is preferable to avoid the degradation.

A condition at the time the microwaves are radiated is preferably a condition in which the temperature of the substrate 1 is not increased as much as possible and is set to a condition in which the substrate temperature of the substrate 1 is within the range of, for example, 200 to 400° C. In this way, substrate 1 can be kept to a low temperature and degradation of the MTJ elements 10 with poor heat resistance can be avoided. Note that the substrate temperature of the substrate 1 at the time is confirmed using a pyrometer located on a back surface of the substrate 1.

However, in this embodiment, the microwaves are preferably electromagnetic waves having a frequency from 2.45 GHz to 25 GHz, in other words, are preferably electromagnetic waves having a wavelength from 1.2 cm to 12.3 cm. Further, in the embodiment, it is preferable to set the radiation time of the microwaves from 30 seconds to 30 minutes.

Further, the radiation power of the microwaves is preferably configured as described below. That is, as shown in FIG. 4, a manufacturing apparatus 20 used when the microwaves are radiated has one or plural waveguides 21 (for example, in FIG. 4, the manufacturing apparatus 20 has four waveguides 21). The waveguides 21 guide the microwaves Wn (In FIG. 4, from $W_1$ to $W_4$) output from a microwave oscillator (not shown) such as a magnetron or the like to the inside of the manufacturing apparatus 20 in which the substrate 1 is installed. It is preferable to adjust the waveguides 21 so that the summation $\Sigma(PWn/Sn)$ of the quotient obtained by dividing the radiation power respective microwaves Wn output from the respective waveguides 21 by the cross sectional area Sn of the respective waveguides 21 corresponding to the power PWn becomes 10 W/cm² to 1 kW/cm². When, for example, this is described using the manufacturing apparatus 20 having the four waveguides 21 shown in FIG. 4 and showing the cross sectional areas of the respective waveguides 21 by $S_1$ to $S_4$ and the powers of the microwaves $W_1$ to $W_4$ output from the respective waveguides 21 by $PW_1$ to $PW_4$, the radiation power of the microwaves are preferably adjusted so that the summation of the quotient $(PW_{1-4}/S_{1-4})$ obtained by dividing the power of the microwaves output from the respective waveguides by the cross sectional areas of the respective waveguides 21, i.e., $PW_1/S_1+PW_2/S_2+PW_3/S_3+PW_4/S_4$ becomes 10 W/cm² to 1 kW/cm². Accordingly, an increase of the waveguides 21 provided with the manufacturing apparatus 20 increases the radiation power of the microwaves defined as described above.

Figure 3:
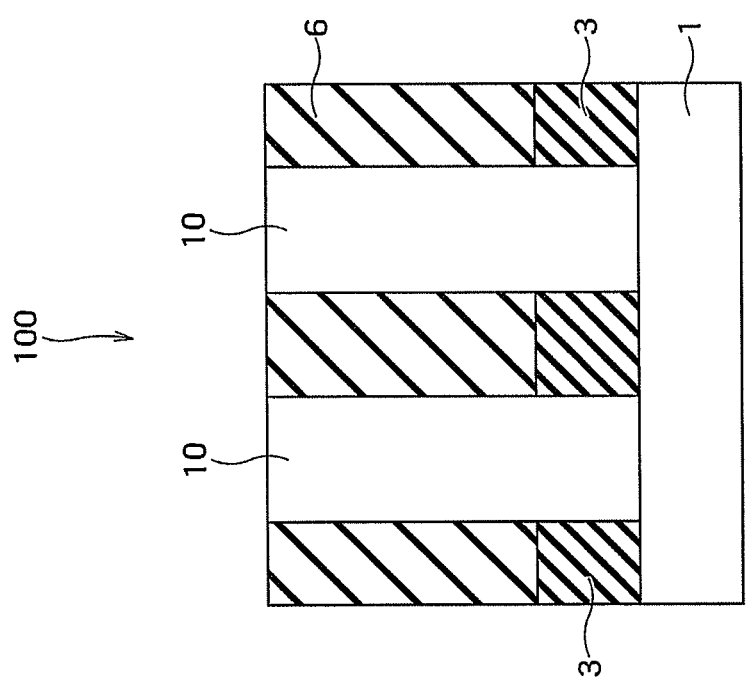
FIG. 3 is a cross-sectional view (part 3) showing the manufacturing method the semiconductor device of the embodiment.
Figure 4:
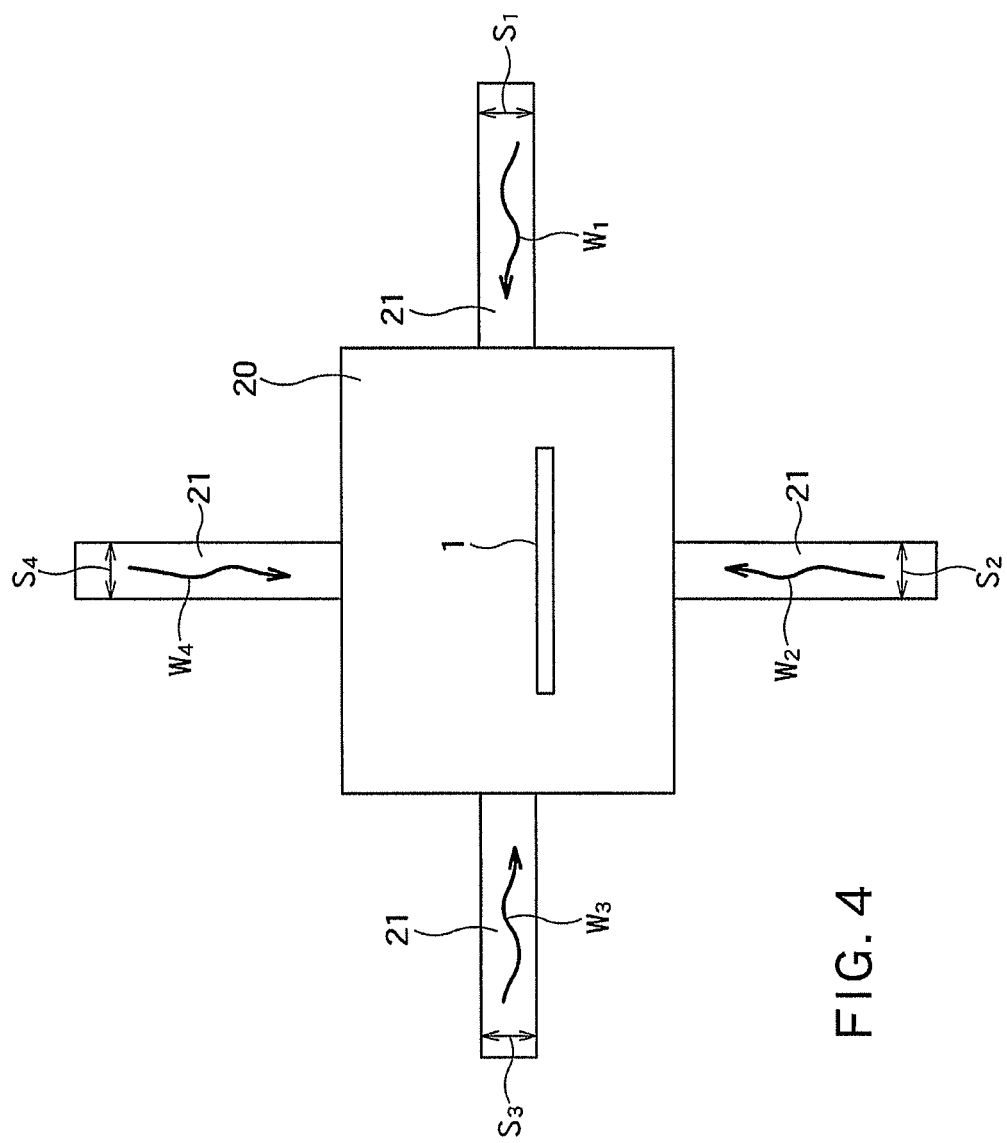
FIG. 4 is a view schematically showing a manufacturing apparatus of the embodiment.

Then, as shown in FIG. 3, the silicon dioxide films 6 are polished using Chemical Mechanical Polishing (CMP) method until upper surfaces of the MTJ elements 10 are exposed. In this way, the silicon dioxide films 6 are interposed between the MTJ elements 10 as upper interlayer dielectric films, thereby the MRAM 100 is formed.

Note that, in the present embodiment, before or after the radiating of microwaves, a hot water treatment of 50° C. to 90° C., a liquid mixture treatment with the use of sulfuric acid-hydrogen peroxide solution mixture, or a combination treatment thereof may be performed.

Characteristics of the silicon dioxide films 6 formed by the embodiment, in more detail, a leak current density and a breakdown electric field intensity were measured.

First, PSZ films were formed on a silicon substrate, the PSZ films were modified to silicon dioxide films using the same method as the embodiment, in other words, radiating microwaves to the PSZ films, and electrodes were formed on the silicon dioxide films. The leak current density and the breakdown electric field intensity were measured by measuring a current by applying a voltage to a capacitor structure obtained in this way by a mercury probe method.

Further, as a comparative example, PSZ films were formed on a silicon substrate and modified to silicon dioxide films by being heated under an atmosphere of 600° C. to 650° C. containing oxygen or water vapor in place of being radiated with microwaves, and electrodes were formed on the silicon dioxide films. A leak current density and a breakdown electric field intensity were measured also as to a capacitor of the comparative example likewise the above case.

Figure 5:
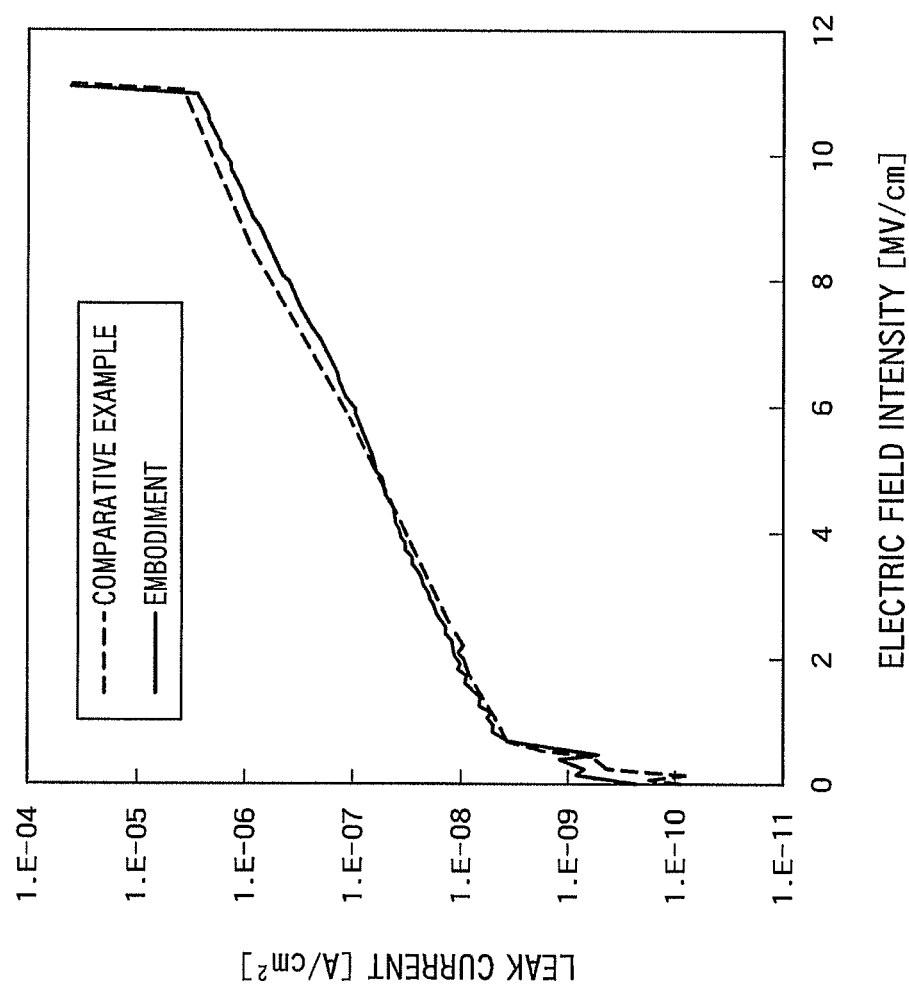
FIG. 5 is a graph showing a leak current density and a breakdown electric field intensity measured as to a capacitor structure formed using the embodiment and as to a capacitor structure as a comparative example.

FIG. 5 shows a result. An x-axis of FIG. 5 shows values obtained by dividing the applied voltage by the thicknesses of the silicon dioxide films of the respective capacitor structures, i.e., electric field intensities (unit: V/cm), and a y-axis of FIG. 5 shows values obtained by dividing the leak currents by the areas of the electrodes of the respective capacitors, i.e., leak current densities (unit: A/cm²). As apparent from the graph, the leak current density and the breakdown electric field intensity of the capacitor structure according to the embodiment show approximately the same results as those of the capacitor structure of the comparative example. That is, the silicon dioxide films according to the embodiment, in other words, the silicon dioxide films obtained by modifying the PSZ films by radiating the microwaves have the equivalent leak current characteristics and the same withstand voltage characteristics as those of the silicon dioxide films obtained by heating the PSZ films under the atmosphere of 600° C. to 650° C. containing the oxygen or the water vapor.

Further, the etching rate of the silicon dioxide films 6 formed by the embodiment to a diluted fluoric acid solution was measured.

First, PSZ films were formed on a silicon substrate, and silicon dioxide films were formed using the same method as the embodiment, in other words, by radiating microwaves to the PSZ film. The film thickness of the silicon dioxide films was previously measured by an ellipsometer. Further, the silicon dioxide films were dipped in a diluted fluoric acid having a predetermined temperature and a predetermined concentration for a predetermined time, and the thickness of the silicon dioxide films was measured again by the ellipsometer. The etching rate was calculated using a result of the measurement.

Further, as a comparative example, PSZ films were formed on a substrate, and silicon dioxide films were formed by heating the PSZ films under an atmosphere of 600° C. to 650° C. containing oxygen or water vapor in place of radiating microwaves. The etching rate was calculated also as to the comparative example likewise the above case.

Also as to the etching rate calculated in this way, the silicon dioxide films according to the embodiment show approximately the same result as the silicon dioxide films of the comparative example. That is, the silicon dioxide films according to the embodiment, in other words, the silicon dioxide films obtained by modifying the PSZ films by radiating the microwaves thereto have an etching rate equivalent to the silicon dioxide films obtained by heating the PSZ films under the atmosphere of 600° C. to 650° C. which contains the oxygen or the water vapor.

That is, according to the embodiment, since the microwaves have a long wavelength of about 5 cm, the radiated microwaves reach up to a back of the PSZ films 5 located between the MTJ elements 10 so that the PSZ films 5 can be effectively modified to the silicon dioxide films 6. Further, since the PSZ films 5 are modified by the action of the microwaves in place that the PSZ films 5 are modified by being heated by the electromagnetic waves having a wavelength shorter than the microwaves, i.e., using ultraviolet rays, visible light rays, infrared rays or the like as in the conventional method, an increase of the substrate temperature can be avoided. Accordingly, when the silicon dioxide films 6 are formed, the silicon dioxide films 6 which have a high breakdown voltage and can suppress a leak current while avoiding degradation of the MTJ elements 10 with poor heat resistance, can be obtained, thereby the MRAM 100 that is good can be formed.

For example, when the PSZ films 5 are modified radiating ultraviolet rays, since the wavelength of the ultraviolet rays is short, about 100 nm, when the ultraviolet rays are compared with the microwaves, radiated ultraviolet rays less reach the back of the PSZ films 5 located between the MTJ elements 10. Accordingly, it is difficult to effectively modify the PSZ films 5 to the silicon dioxide films 6. Further, since the ultraviolet rays have high energy, the modification reaction of the PSZ films 5 by the radiation of the ultraviolet light is excessively promoted, oxygen may be captured into the created silicon dioxide films 6 more than the stoichiometric proportion. A charge is generated in the silicon dioxide films 6 by the oxygen captured in the large amount, with a result that characteristics of the silicon dioxide films 6 such as a withstand voltage and a leak current are degraded.

In contrast, in the embodiment, polarized molecules in the PSZ films 5 are rotated by radiating the microwaves, thereby gently performing the modification reaction of the PSZ films 5. Accordingly, it is possible to avoid that oxygen is captured in the silicon dioxide films 6 more than the stoichiometric proportion and that the charge is generated, thereby it can be avoided that characteristics of the silicon dioxide films 6 such as the withstand voltage and the leak current are degraded.

Further, in the embodiment, power consumption when the semiconductor device 100 is manufactured becomes smaller by using the microwaves in comparison with the case that the ultraviolet rays are used. Further, since the microwaves pass through quartz, the microwaves can be easily assembled in the manufacturing apparatus.

Second Embodiment

To form the silicon dioxide films 6 as upper interlayer dielectric films, although the PSZ films 5 are used as a silicon compound material in the first embodiment, the second embodiment uses organic Spin on Glass (SOG). Main components of the organic SOG are silicon, oxygen, carbon, and hydrogen. When the silicon dioxide films 6 are formed between the MTJ elements 10, since the use of the organic SOG causes stress to be less generated to the substrate 1 than when the PSZ films 5 are used, defect can be more preventable from being generated to the substrate 1. Further, when the organic SOG is used, less nitrogen remains in the silicon dioxide films 6 formed by the organic SOG in comparison with the case that the silicon dioxide films are formed using the PSZ films, it can be suppressed that a fixed charge is generated in the silicon dioxide films 6 due to nitrogen.

Since the drawings for describing a manufacturing method of the semiconductor device of the second embodiment are shown in the same way as the drawings used to describe the first embodiment, the manufacturing method of the semiconductor device according to the second embodiment will be described using FIGS. 1A to 3. Detailed description of the sections common to the first embodiment is omitted here. Note that, although description is made using the manufacturing method of an MRAM 100 as an example below, the present invention is not limited to such a semiconductor device likewise the first embodiment and the manufacturing method can be used also in other types of semiconductor devices and can be used to a manufacturing method of a cross-point memory such as, for example, ReRAM having a variable resistive element with poor heat resistance.

First, likewise the first embodiment, a substrate 1 on which plural MTJ elements 10 are formed in a matrix state is prepared as shown in FIG. 1A.

Next, as shown in FIG. 1B, an organic SOG solution (a silicon compound material) 4 is applied to the entire surface of the substrate 1. Application of the organic SOG solution 4 allows the organic SOG solution 4 to be buried between the MTJ elements 10 with a good step covering property.

Next, as shown in FIG. 2A, a solvent contained in the organic SOG solution 4 is volatilized by performing baking at a temperature between 200° C. to 300° C., and organic SOG films (silicon compound films) 5 are formed on and between the MTJ elements 10. Note that when the solvent includes a molecule structure having polarization, since the solvent is volatilized when microwaves are radiated at a next step likewise the first embodiment, the baking may be omitted.

Thereafter, as shown in FIG. 2B, the microwaves are radiated to the substrate 1 under an atmosphere which contains inert gas such as nitrogen, argon or the like, preferably under an atmosphere which does not contain oxygen, thereby modifying the organic SOG films 5 to silicon dioxide films 6. In more detail, since an organic functional group contained in the organic SOG films 5 is separated, the organic SOG films 5 are modified to the silicon dioxide films 6.

A condition at the time the microwaves are radiated is preferably a condition in which the temperature of the substrate 1 is not increased as much as possible and is set to a condition in which the substrate temperature of the substrate 1 is, for example, within the range of 200° C. to 400° C. likewise the first embodiment. In this way, the substrate 1 can be kept to a low temperature and degradation of the MTJ elements 10 with poor heat resistance can be avoided. Note that, since a detailed microwave radiating condition (pressure, frequency, radiating time, and radiation power) is the same as the first embodiment, description of the condition is omitted here.

Then, as shown in FIG. 3, the silicon dioxide films 6 are polished using CMP method until upper surfaces of the MTJ elements 10 are exposed. In this way, the silicon dioxide films 6 are interposed between the MTJ elements 10 as upper interlayer dielectric films, thereby the MRAM 100 is formed.

That is, according to the embodiment, since the microwaves reach up to backs of the organic SOG films 5 located between MTJ elements 10 by radiating the microwaves, the organic SOG films 5 can be effectively modified to the silicon dioxide films 6. Further, since the SOG films 5 are modified by the action of the microwaves in place that the organic SOG films 5 are modified by being heated as in the conventional method, it can be avoided that a substrate temperature becomes high. Accordingly, when the silicon dioxide films 6 are formed, the silicon dioxide films 6 which have a high breakdown voltage and the leak current of which can be suppressed can be obtained while avoiding that the MTJ elements 10 with poor heat resistance are degraded, thereby the MRAM 100 that is good can be formed.

Further, according to the embodiment, the use of the organic SOG can avoid generation of defect on the substrate 1 by reducing stress generated to the substrate 1 when the silicon dioxide films 6 are formed between the MTJ elements 10. Further, reduction of nitrogen remaining in the silicon dioxide films 6 can suppress generation of a fixed charge in the silicon dioxide films 6.

Then, also in the embodiment, since the microwaves are used, a power consumption when the semiconductor device 100 is manufactured is smaller than the case that ultraviolet rays are used. Further, since the microwaves pass through quartz, the microwaves can be easily assembled in the manufacturing apparatus.

Note that, in the first and second embodiments, the substrate 1 need not always be a silicon substrate and may be other substrate (for example, Silicon On Insulator (SOI) substrate, SiGe substrate or the like). Further, a semiconductor structure or the like may be formed on such various substrates.

While certain embodiments have been described, these embodiments have been presented by way of example only, and are not intended to limit the scope of the present inventions. Indeed, the novel methods and systems described herein may be embodied in a variety of other forms; furthermore, various omissions, substitutions and changes in the form of the methods and systems described herein may be made without departing from the spirit of the present inventions. The accompanying claims and their equivalents are intended to cover such forms or modifications as would fall within the scope and spirit of the present inventions.

The invention claimed is:

1. A manufacturing method of a semiconductor device comprising:
    forming a plurality of elements on a substrate;
    forming and burying a silicon compound film between the plurality of elements; and
    radiating the silicon compound film with microwaves to produce a silicon dioxide film,
    wherein the microwaves are radiated to the silicon compound film under an atmosphere having a pressure at which no radical is generated by the microwaves.

2. The manufacturing method of the semiconductor device according to claim 1, wherein the microwaves have a frequency between 2.45 GHz and 25 GHz.

3. The manufacturing method of the semiconductor device according to claim 1, wherein the temperature of the substrate is between 200° C. and 400° C. while the microwaves are being radiated.

4. The manufacturing method of the semiconductor device according to claim 1, wherein the power density of the microwaves is between 10 W/cm$^2$ and 1 kW/cm$^2$.

5. The manufacturing method of the semiconductor device according to claim 1, wherein the radiating time of the microwaves is between 30 seconds and 30 minutes.

6. The manufacturing method of the semiconductor device according to claim 1, further comprising polishing an upper surface of the silicon dioxide film after the silicon compound film is modified to the silicon dioxide film.

7. The manufacturing method of the semiconductor device according to claim 1, wherein the silicon compound film is formed by applying a silicon compound solution to the substrate.

8. The manufacturing method of the semiconductor device according to claim 1, wherein the silicon compound film is formed by applying a silicon compound solution to the substrate and volatilizing a solvent contained in the silicon compound solution.

9. The manufacturing method of the semiconductor device according to claim 8, wherein the solvent is volatilized by baking the substrate at the temperature between 200° C. and 300° C.

10. The manufacturing method of the semiconductor device according to claim 1, wherein the silicon compound film comprises a polysilazane film.

11. The manufacturing method of the semiconductor device according to claim 10, wherein the microwaves are radiated to the substrate under an atmosphere containing oxygen or water vapor.

12. The manufacturing method of the semiconductor device according to claim 1, wherein the silicon compound film comprises a polysilazane film or an organic SOG film.

13. The manufacturing method of the semiconductor device according to claim 12, wherein the microwaves are radiated to the substrate under an atmosphere containing nitrogen or inert gas.

14. The manufacturing method of the semiconductor device according to claim 1, wherein the element is an MTJ element.

15. The manufacturing method of the semiconductor device according to claim 1, wherein the element is a variable resistive element.

16. The manufacturing method of the semiconductor device according to claim 1, wherein before or after the radiating of microwaves, a hot water treatment of 50° C. to 90° C., a liquid mixture treatment with the use of sulfuric acid-hydrogen peroxide solution mixture, or a combination treatment thereof is performed.

* * * * *